(12) United States Patent
Shigezane et al.

(10) Patent No.: US 8,952,498 B2
(45) Date of Patent: Feb. 10, 2015

(54) SEMICONDUCTOR DEVICE HAVING PLURAL STACKED CHIPS

(75) Inventors: Yasuyuki Shigezane, Shizuoka (JP); Hideyuki Yokou, Tokyo (JP); Akira Ide, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 136 days.

(21) Appl. No.: 13/434,395

(22) Filed: Mar. 29, 2012

(65) Prior Publication Data

US 2012/0248600 A1  Oct. 4, 2012

(30) Foreign Application Priority Data

Mar. 30, 2011  (JP) ................................ 2011-075402

(51) Int. Cl.
  *H01L 29/40*  (2006.01)
  *H01L 23/48*  (2006.01)
  *H01L 23/00*  (2006.01)
  *H01L 25/065*  (2006.01)

(52) U.S. Cl.
  CPC .............. *H01L 23/481* (2013.01); *H01L 24/14* (2013.01); *H01L 25/0657* (2013.01); *H01L 24/13* (2013.01); *H01L 2224/13021* (2013.01); *H01L 2224/13082* (2013.01); *H01L 2224/13111* (2013.01); *H01L 2224/13144* (2013.01); *H01L 2224/13155* (2013.01); *H01L 2224/14181* (2013.01); *H01L 2224/13009* (2013.01); *H01L 2224/13025* (2013.01); *H01L 2924/00013* (2013.01); *H01L 2924/01029* (2013.01); *H01L 2224/16145* (2013.01); *H01L 2224/16225* (2013.01); *H01L 2225/06517* (2013.01); *H01L 2924/15311* (2013.01); *H01L 2225/06513* (2013.01); *H01L 2225/06541* (2013.01); *H01L 2225/06565* (2013.01); *H01L 2224/05567* (2013.01)

USPC ........................................................ 257/621

(58) Field of Classification Search
  CPC ........... H01L 2225/06541; H01L 2225/06544; H01L 23/481; H01L 23/535; H01L 23/4012; H01L 25/043; H01L 25/0657; H01L 25/074; H01L 25/117; H01L 25/0756; H01L 25/06555
  USPC .......................... 257/621, 686, 777, 723, 724
  See application file for complete search history.

(56) References Cited

U.S. PATENT DOCUMENTS

| | | | |
|---|---|---|---|
| 7,944,058 B2 | 5/2011 | Ishihara | |
| 8,110,900 B2 * | 2/2012 | Yoshimura et al. | 257/621 |
| 8,310,033 B2 * | 11/2012 | Jin et al. | 257/621 |
| 8,330,278 B2 * | 12/2012 | Lee et al. | 257/777 |
| 8,492,905 B2 * | 7/2013 | Suh | 257/777 |
| 8,558,395 B2 * | 10/2013 | Khan et al. | 257/778 |
| 2008/0265430 A1 | 10/2008 | Ishihara | |
| 2009/0127668 A1 * | 5/2009 | Choi | 257/621 |

(Continued)

FOREIGN PATENT DOCUMENTS

JP  2005-136187 A  5/2005

*Primary Examiner* — David Zarneke
(74) *Attorney, Agent, or Firm* — Sughrue Mion, PLLC

(57) ABSTRACT

Disclosed herein is a device including a substrate and first and second chips stacked on the substrate. The first and second chips have penetration electrodes that are penetrating therethrough. Power terminals of the first and second chips are connected to each other and arranged in a first arrangement pitch. Signal terminals of the first and second chips are connected to each other and arranged in a second arrangement pitch that is smaller than the first arrangement pitch.

19 Claims, 13 Drawing Sheets

(56) References Cited

U.S. PATENT DOCUMENTS

| | | | |
|---|---|---|---|
| 2011/0109381 A1* | 5/2011 | Foster et al. | 327/565 |
| 2011/0201178 A1 | 8/2011 | Ishihara | |
| 2012/0013024 A1* | 1/2012 | Sasaki et al. | 257/777 |
| 2012/0286431 A1* | 11/2012 | Foster et al. | 257/774 |
| 2013/0214855 A1* | 8/2013 | Foster et al. | 327/544 |
| 2013/0228898 A1* | 9/2013 | Ide | 257/621 |
| 2013/0234296 A1* | 9/2013 | Fay et al. | 257/621 |
| 2014/0035163 A1* | 2/2014 | Khan et al. | 257/774 |

\* cited by examiner

SEMICONDUCTOR DEVICE HAVING PLURAL STACKED CHIPS

BACKGROUND OF THE INVENTION

1. Field of the Invention

The present invention relates to a semiconductor device, and more particularly relates to a semiconductor device having a plurality of semiconductor chips stacked to each other and electrically connected to each other by using penetration electrode penetrating through the semiconductor chips.

2. Description of Related Art

A stacked semiconductor device including a plurality of stacked semiconductor chips has been recently proposed. In this type of semiconductor device, penetration electrodes or through silicon visa are formed in the semiconductor chips, and signals and power are supplied through the penetration electrodes. For example, a semiconductor device having a configuration in which three semiconductor chips are stacked on a substrate is shown in FIG. 20 of Japanese Patent Application Laid-open No. 2005-136187. In this semiconductor device, supply of signals and power is performed from the side of the substrate, which means that the signals and power are supplied from a lowermost semiconductor chip to an uppermost semiconductor chip.

However, in the semiconductor device indicated in Japanese Patent Application Laid-open No. 2005-136187, the planar position of the penetration electrodes provided in each semiconductor chip is different for every semiconductor chip. Therefore, in order to connect corresponding penetration electrodes, wiring extending in planar direction is necessary. The wiring extending in planar direction has large electrical resistance compared with a penetration electrode. When power was supplied through such wiring, there was a problem that power supply voltage drops in the more upper semiconductor chip

SUMMARY

In one embodiment, there is provided a semiconductor device that includes: a substrate on which a plurality of substrate terminals including a plurality of substrate power supply terminals are provided; a first semiconductor chip stacked on the substrate, the first semiconductor chip having one surface on which a plurality of first chip terminals each connected to an associated one of the substrate terminals are provided and the other surface on which a plurality of second chip terminals including a plurality of chip power supply terminals and a plurality of chip signal terminals are provided; and a second semiconductor chip stacked on the first semiconductor chip, the second semiconductor chip having one surface on which a plurality of third chip terminals each connected to an associated one of the second chip terminals are provided. The first semiconductor chip has a plurality of power supply penetration electrodes each penetrating through the first semiconductor chip and electrically connecting an associated one of the chip power supply terminals to an associated one of the substrate power supply terminals. Each of the power supply penetration electrodes is vertically aligned with the associated one of the chip power supply terminals and the associated one of the substrate power supply terminals. The chip signal terminals have an arrangement pitch smaller than an arrangement pitch of the chip power supply terminals.

In another embodiment, there is provided a semiconductor device that includes: a substrate having one surface on which a plurality of first and second terminals are provided, the first terminals being supplied with a power supply voltage, and second terminals being supplied with first signals; a first semiconductor chip stacked on the substrate, the first semiconductor chip having one surface on which a plurality of third and fourth terminals are provided and the other surface on which a plurality of fifth and sixth terminals are provided, each of the third terminals being connected to an associated one of the first terminals, and each of the fourth terminals being connected to an associated one of the second terminals; and a second semiconductor chip stacked on the first semiconductor chip, the second semiconductor chip having one surface on which a plurality of seventh and eighth terminals are provided, each of the seventh terminals being connected to an associated one of the fifth terminals, and each of the eighth terminals being connected to an associated one of the sixth terminals. The fifth and seventh terminals are supplied with the power supply voltage. The sixth and eighth terminals are supplied with second signals. The fifth and seventh terminals are arranged in a first arrangement pitch. The sixth and eighth terminals are arranged in a second arrangement pitch that is smaller than the first arrangement pitch.

In still another embodiment, there is provided a device that includes: a semiconductor substrate including first and second surfaces opposite to each other; first and second penetration electrodes each penetrating through the semiconductor substrate; first and second bumps each formed on aside of the first surface of the semiconductor substrate, the first bump being electrically connected to and vertically aligned with the first penetration electrode, and the second bump being electrically connected to and vertically aligned with the second penetration electrode; and third and fourth bumps each formed on a side of the second surface of the semiconductor substrate, the third bump being electrically connected to and vertically aligned with the first penetration electrode, and fourth bump being electrically connected to and vertically deviated from the second penetration electrode.

DETAILED DESCRIPTION OF THE EMBODIMENTS

Preferred embodiments of the present invention will be explained below in detail with reference to the accompanying drawings.

Figure 1:
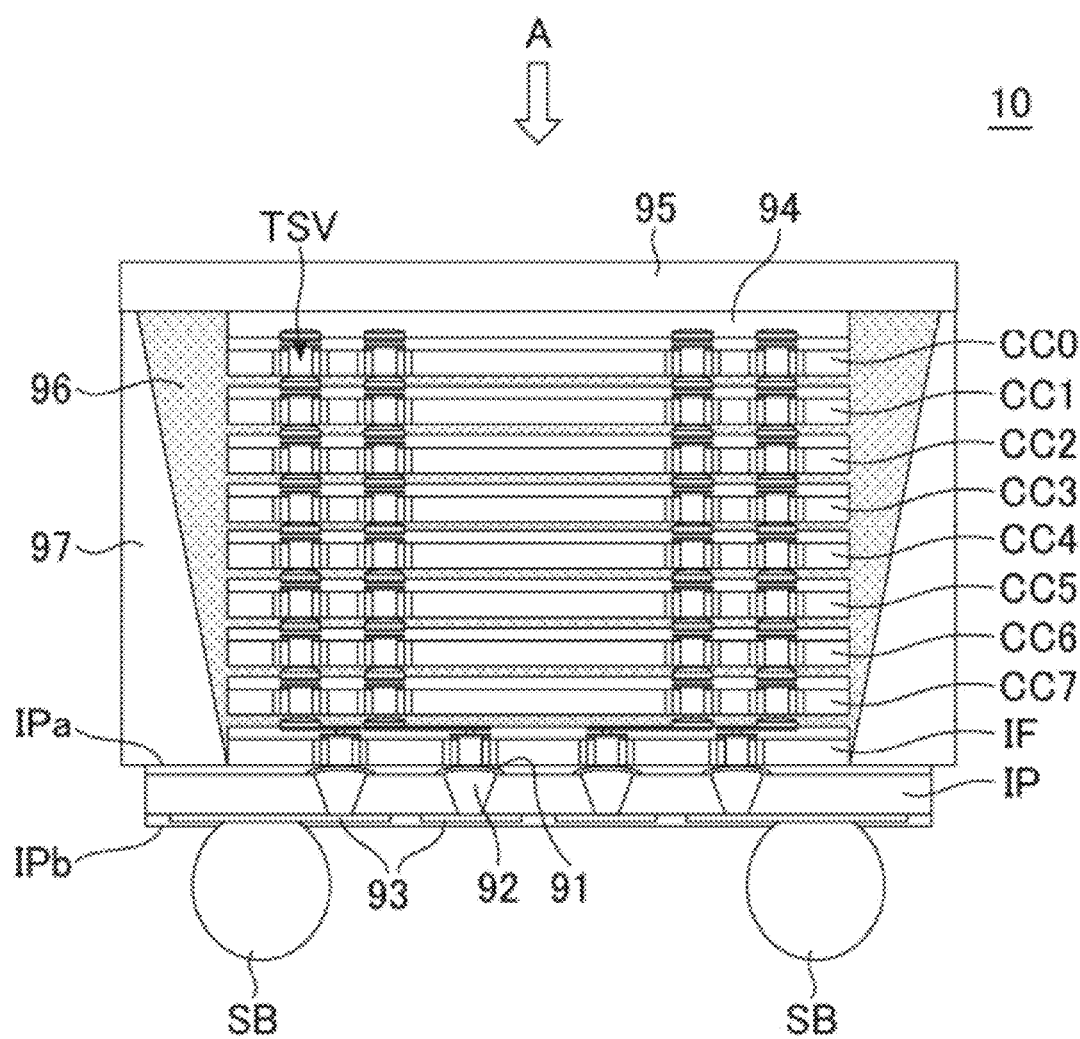
FIG. 1 is a schematic cross-sectional view for explaining a structure of a semiconductor device 10 according to an embodiment of the present invention.

Referring now to FIG. 1, the semiconductor device 10 according to this embodiment has the structure where eight core chips (memory chips) CC0 to CC7 and an interface chip IF or memory chip controller are stacked on an interposer IP. The core chips CC0 to CC7 have the same function and structure as one another. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 are manufactured using the same manufacture mask whereas the interface chip IF is manufactured using a manufacture mask different from that of the core chips CC0 to CC7. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon via may be referred to as a penetration electrode. The uppermost core chip CC0 may not have the through silicon via TSV. Meanwhile, the interposer IP is a circuit board that is made of a resin, and plural external terminals (solder balls) SB are formed in a back surface IPb of the interposer IP.

Each of the core chips CC0 to CC7 is a semiconductor chip on which only a back end unit of the circuit blocks included in the ordinary stand-alone SDRAM (Synchronous Dynamic Random Access Memory) normal is integrated. That is, each of the core chips CC0 to CC7 does not have a front end unit. As the circuit blocks included in the front end unit, a parallel-serial converting circuit that performs parallel/serial conversion on input/output data between a memory cell array and a data input/output terminal and a DLL (Delay Locked Loop) circuit that controls input/output timing of data are exemplified, which will be described in detail below.

On the other hand, the interface chip IF is a semiconductor chip on which only the front-end unit of the circuit blocks included in the normal stand-alone SDRAM is integrated. The interface chip IF functions as a common front end unit for the eight core chips CC0 to CC7. Accordingly, all external accesses are performed through the interface chip IF and inputs/outputs of data are also performed through the interface chip IF.

The interposer IP functions as a rewiring substrate to increase an electrode pitch and secures mechanical strength of the semiconductor device 10. That is, an electrode (substrate terminal) 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
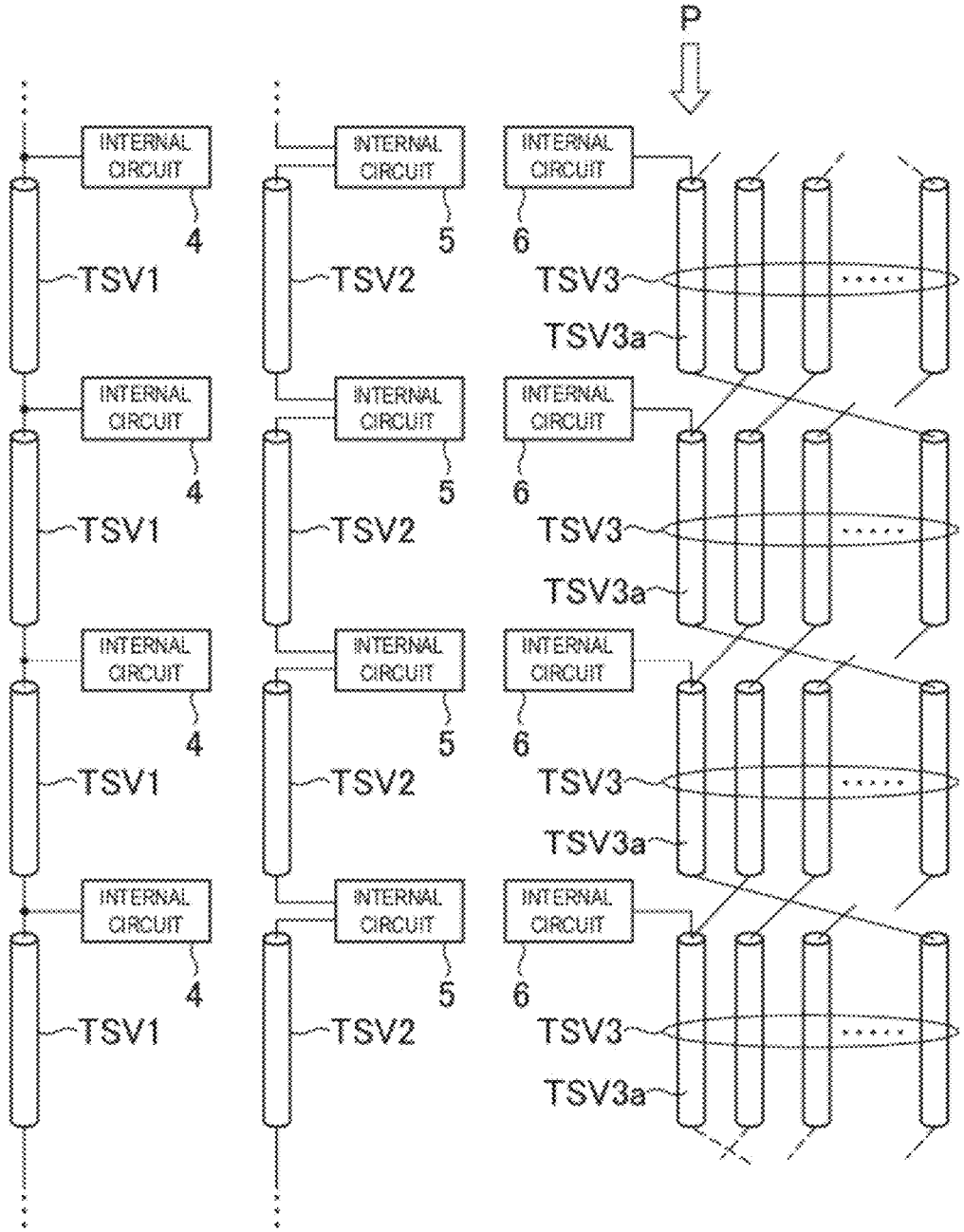
FIGS. 2A to 2C are diagrams indicative of an embodiment of various types of through silicon via TSV provided in a core chip.

When the through silicon vias TSV provided in the core chips CC0 to CC7 are two-dimensionally viewed from a lamination direction, that is, viewed from an arrow A shown in FIG. 1, most of the through silicon vias TSV are short-circuited from the through silicon vias TSV of other layers provided at the same position. That is, as shown in FIG. 2A, the vertically disposed through silicon vias TSV1 that are provided at the same position in planar view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Meanwhile, as shown in FIG. 2B, the a part of the through silicon vias TSV are not directly connected to the through silicon via TSV2 of other layers provided at the same position in planar view but are connected to the through silicon via TSV2 of other layers through the internal circuits 5 provided in the core chips CC0 to CC7. That is, the internal circuits that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, chip address information to be described below is exemplified.

Another part of the through silicon vias TSV is short-circuited from the through silicon vias TSV of other layer provided at the different position in planar view, as shown in FIG. 2C. With respect to this kind of through silicon vias TSV group 3, internal circuits 6 of the core chips CC0 to CC7 are connected to the through silicon via TSV3*a* provided at the predetermined position P in planar view. Thereby, information can be selectively input to the internal circuits 6 provided in the core chips. As this information, defective chip information is exemplified.

As such, three types of through silicon vias TSV1 to TSV3 shown in FIGS. 2A to 2C are provided in the core chips CC0 to CC7. As described above, most of the through silicon vias TSV are of a type shown in FIG. 2A, and an address signal and a command signal, and the like are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 whereas the core chips CC0 to CC7 have the same structure as one another.

As described above, the through silicon vias TSV formed in the core chips CC0 to CC7 have the same plan formation positions as viewed from a stacking direction regardless of which type among those shown in FIGS. 2A to 2C the through silicon vias are. Correspondingly, the through silicon vias TSV formed in the interface chip IF also have the same plane formation positions as those of the through silicon vias TSV formed in the core chips CC0 to CC7.

Figure 3:
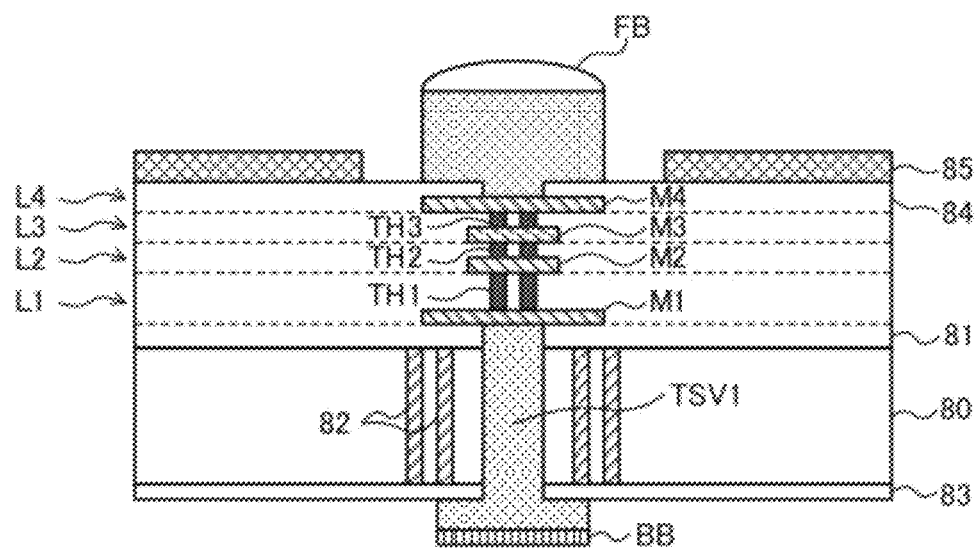
FIG. 3 is a cross-sectional view of a configuration of the through silicon via TSV1 of the type shown in FIG. 2A.

Turning to FIG. 3, the through silicon via TSV1 is provided by penetrating a silicon substrate 80, an interlayer dielectric film 81 on a surface of the silicon substrate 80, and a passivation film 83 on a back surface of the silicon substrate 80. The through silicon via TSV1 is made of Cu (copper), although it is not particularly limited thereto. The surface of the silicon substrate 80 is a device forming surface where a device such as a transistor is formed. An insulating ring 82 is provided around the through silicon via TSV1 and thus insulation between the through silicon via TSV1 and a transistor region is ensured. Two insulating rings 82 are provided in an example of FIG. 3, so that an electrostatic capacity between the through silicon via TSV1 and the silicon substrate 80 is reduced.

An end of the through silicon via TSV1 on a back surface side of the silicon substrate 80 is covered by a back surface bump BB. The back surface bump BB is an electrode that contacts a front surface bump FB provided on an underlying core chip or the interface chip IF and has a configuration of stacking Ni (nickel) and Au (gold), although the material is not particularly limited thereto. The front surface bump FB is connected through pads M1 to M4 provided in wiring layers L1 to L4 and a plurality of through-hole electrodes TH1 to TH3 that connect between the pads to an end of the through silicon via TSV1. The front surface bump FB is made of a SnAg solder, although it is not particularly limited thereto. The diameter of the front surface bump FB and the back surface bump BB is about 20 μm. In the present embodiment, the front surface bump FB and the back surface bump BB may be occasionally simply referred to as "chip terminal".

With the above configuration, the front surface bump FB and the back surface bump BB provided at the same position in a planar view are short-circuited. The front surface bump FB is provided by penetrating a passivation film 84. The surface of the passivation film 84 is covered by a polyimide film 85 except for a region where the front surface bump FB is formed. Connection to an internal circuit (not shown) is performed through an internal wiring (not shown) extracted from the pads M1 to M3 provided in the wiring layers L1 to L3.

The through silicon via TSV1 shown in FIG. 3 is used for most of the through silicon vias in the core chips CC0 to CC7 and is also used for a through silicon via for power supply (power supply through silicon via) in the interface chip IF. As described above, the through silicon via TSV1 shown in FIG. 3 is characterized such that the front bump FB and the back bump BB formed at the same position in planar view are short-circuited with each other.

Figure 4:
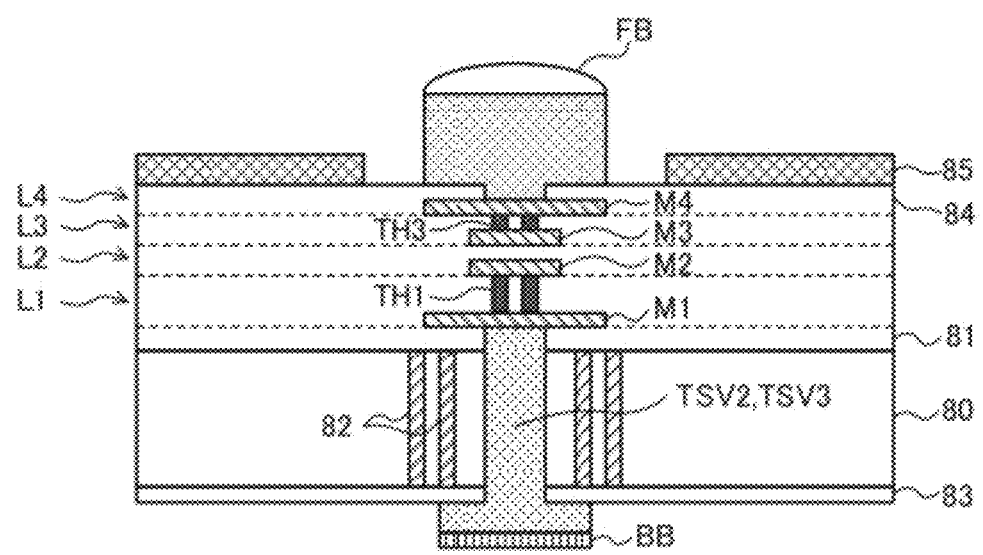
FIG. 4 is a cross-sectional view of a configuration of the through silicon via TSV2 of the type shown in FIG. 2B and the through silicon via TSV3 of the type shown in FIG. 2C.

Turning to FIG. 4, the through silicon vias TSV2 and TSV3 are different from the through silicon via TSV1 shown in FIG. 3 in that the through-hole electrode TH2 for directly connecting the pads M2 and M3 at the same planar position is omitted. According to the through silicon via TSV2 of the type shown in FIG. 2B, the pad M2 is connected to, for example, an output node of the internal circuit 5 shown in FIG. 2 and the pad M3 is connected to, for example, an input node of the internal circuit 5 shown in FIG. 2. Accordingly, the internal circuits 5 provided in the respective core chips CC0 to CC7 are cascade-connected to each other through the through silicon vias TSV2. According to the through silicon via TSV3 of the type shown in FIG. 2C, the pad M2 is connected to the front surface bump FB whose planar position is the same as that of another through silicon via TSV3 and the pad M3 is connected to yet another through silicon via TSV3.

The through silicon vias TSV2 and TSV3 shown in FIG. 4 are characterized such that while being formed at the same position in planar view, each pair of the front bump FB and the back bump BB are not short-circuited with each other. The through silicon vias TSV2 and TSV3 are used for some through silicon vias in the core chips CC0 to CC7; however, they are not basically used in the interface chip IF.

As described above, the through silicon vias TSV1 to TSV3 shown in FIGS. 3 and 4 are mainly used in the core chips CC0 to CC7 and, in all of the through silicon vias, each pair of the front bump FB and the back bump BB are formed at the same position in planar view. In contrast, because connection on the side of the core chips CC0 to CC7 and connection on the side of the interposer IP needs to be established at different pitches in the interface chip IF, most of the plan positions of the front bumps FB are different from the plan positions of the back bumps BB.

Figure 5:
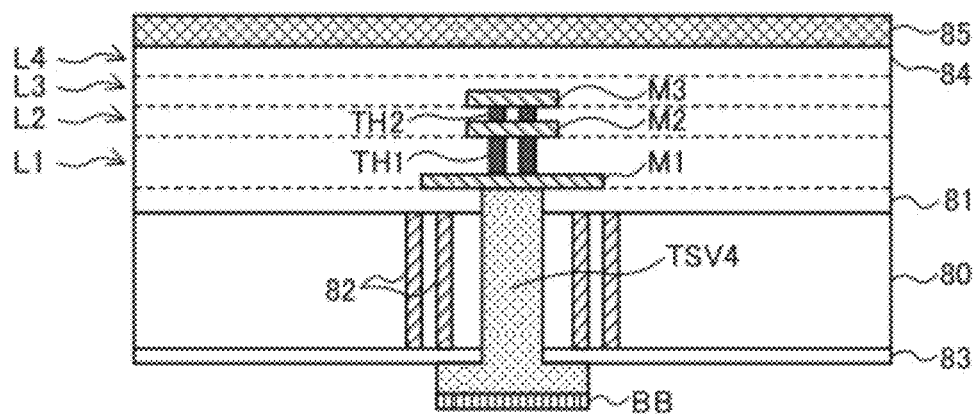
FIG. 5 is a cross-sectional view for explaining a configuration of the back surface bump BB provided on the interface chip IF.
Figure 6:
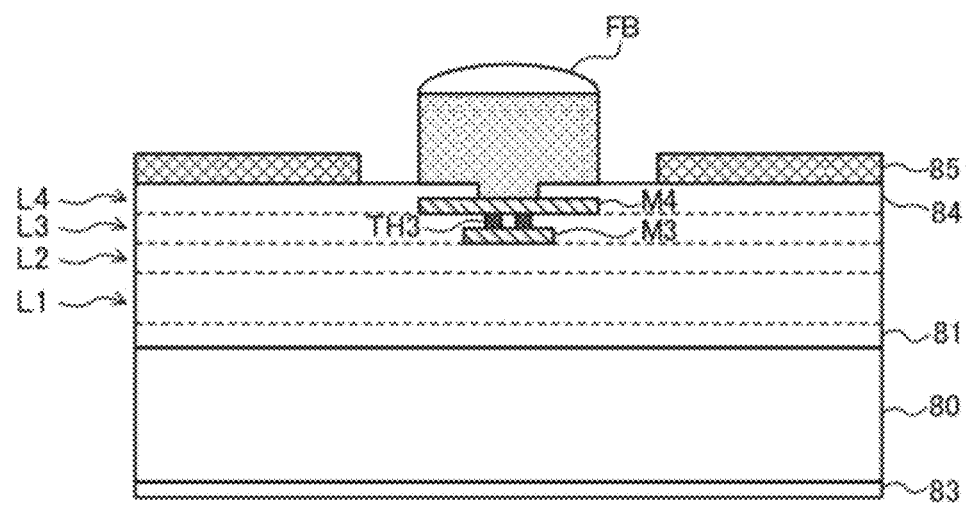
FIG. 6 is a cross-sectional view for explaining a configuration of the front surface bump FB provided on the interface chip IF.

Turning to FIG. 5, the back surface bump BB provided on the interface chip IF is connected through a through silicon via TSV4 to the pads M1 to M3; however, the pad M4 and the front surface bump FB are not provided above the back surface bump BB. The through silicon via TSV4 shown in FIG. 5 is used for through silicon vias for signals (signal through silicon via) in the interface chip IF. Meanwhile, as shown in FIG. 6, the front surface bump FB provided on the interface chip IF is connected to the pads M4 and M3, the pads M2 and M1, the through silicon via TSV, and the back surface bump BB are not provided below the front surface bump FB. The back surface bump BB and the front surface bump FB are connected to a logic circuit (not shown) in the interface chip IF.

The front bump FB shown in FIG. 6 is a bump on a side connected to the interposer IP and may be also referred to as "first chip terminal" in the present invention. The back bump BB shown in FIG. 5 is a bump on a side connected to the core chips CC0 to CC7 and may be also referred to as "second chip terminal" in the present invention.

Because the front bump FB is a bump on the side connected to the interposer IP, an arrangement pitch thereof needs to be matched to an arrangement pitch of the substrate terminals 91 formed in the interposer IP. The interposer IP has a processing accuracy lower than that of the semiconductor chip and thus the arrangement pitch of the front bump FB is relatively large. On the other hand, because the back bump BB is a bump on the side connected to the core chips CC0 to CC7, an arrangement pitch thereof needs to be matched to an arrangement pitch of the through silicon vias TSV formed in the core chips CC0 to CC7. The core chips CC0 to CC7 have a processing accuracy higher than that of the interposer IP and thus the arrangement pitch of the back bump BB is relatively small.

Figure 7:
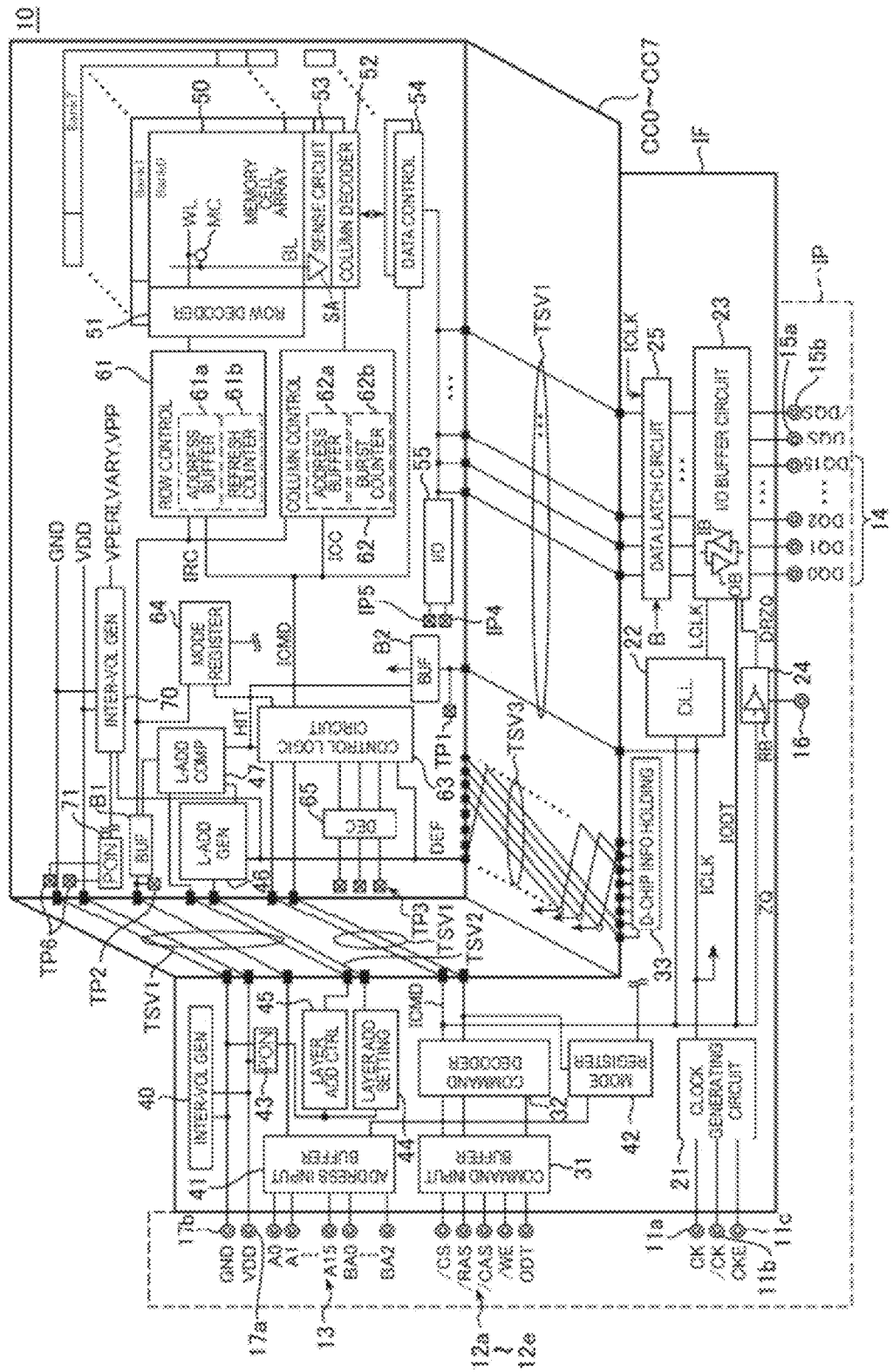
FIG. 7 is a block diagram indicative of an embodiment of a circuit configuration of the semiconductor device 10.

Turning to FIG. 7, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer 23, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each bank of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

In this way, the parallel data without being converted into serial data are basically input or output between the data latch circuit 25 and the core chips CC0 to CC7. More specifically, the number of bits of unit internal data to be simultaneously input or output between each of the core chips CC0 to CC7 and the interface chip IF is larger than the number of bits of unit external data to be simultaneously input or output between the interface chip IF and the outside. That is, the data latch circuit 25 functions to convert serial unit external data into parallel unit internal data and convert parallel unit internal data into serial unit external data.

That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and GND are supplied, respectively. The power supply terminals 17a and 17b are connected to an internal voltage generating circuit 40 and a power-on detecting circuit 43 provided in the interface chip IF and are also connected to the core chips CC0 to CC7 through the through silicon vias TSV. The internal voltage generating circuit 40 receives the power supply potentials VDD and GND and generates various internal voltages. The power-on detecting circuit 43 is a circuit that detects power-on, and activates a layer-address control circuit 45 provided in the interface chip IF upon detection of power-on.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described. The core chips CC0 to CC7 are chips that enable a read operation or writing operation by performing a row access and a column access in this order.

As shown in FIG. 7, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, external terminals (for example, plural control terminals and plural I/O terminals) of the semiconductor device are shared. In the memory cell array 50, the plural word lines WL and the plural bit lines BL intersect each other, and memory cells MC are disposed at intersections thereof (in FIG. 7, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers, for example) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and GND. The internal voltage generating circuit 70 receives these power supply potentials and generates various internal voltages. As the internal voltages that are generated by the internal voltage generating circuit 70, an internal voltage VPERI ($\approx$VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal, a test data, or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

The kind of the test pads TP is almost the same as those of the external terminals provided in the interposer IP. Specifically, the test pads TP include a test pad TP1 supplied with the clock signal, a test pad TP2 supplied with the address signal, test pads TP3 supplied with the command signal, a test pad TP4 for performing input/output of test data, a test pad TP5 for performing input/output of data strobe signal, test pads 6 for supplying power-supply voltages.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 GB are laminated, the semiconductor memory device 10 has a memory capacity of 8 GB in total. Because the chip selection signal /CS is input to one terminal (chip selection terminal), the semiconductor memory device is recognized as a single DRAM having the memory capacity of 8 GB, in view of the controller.

Figure 8:
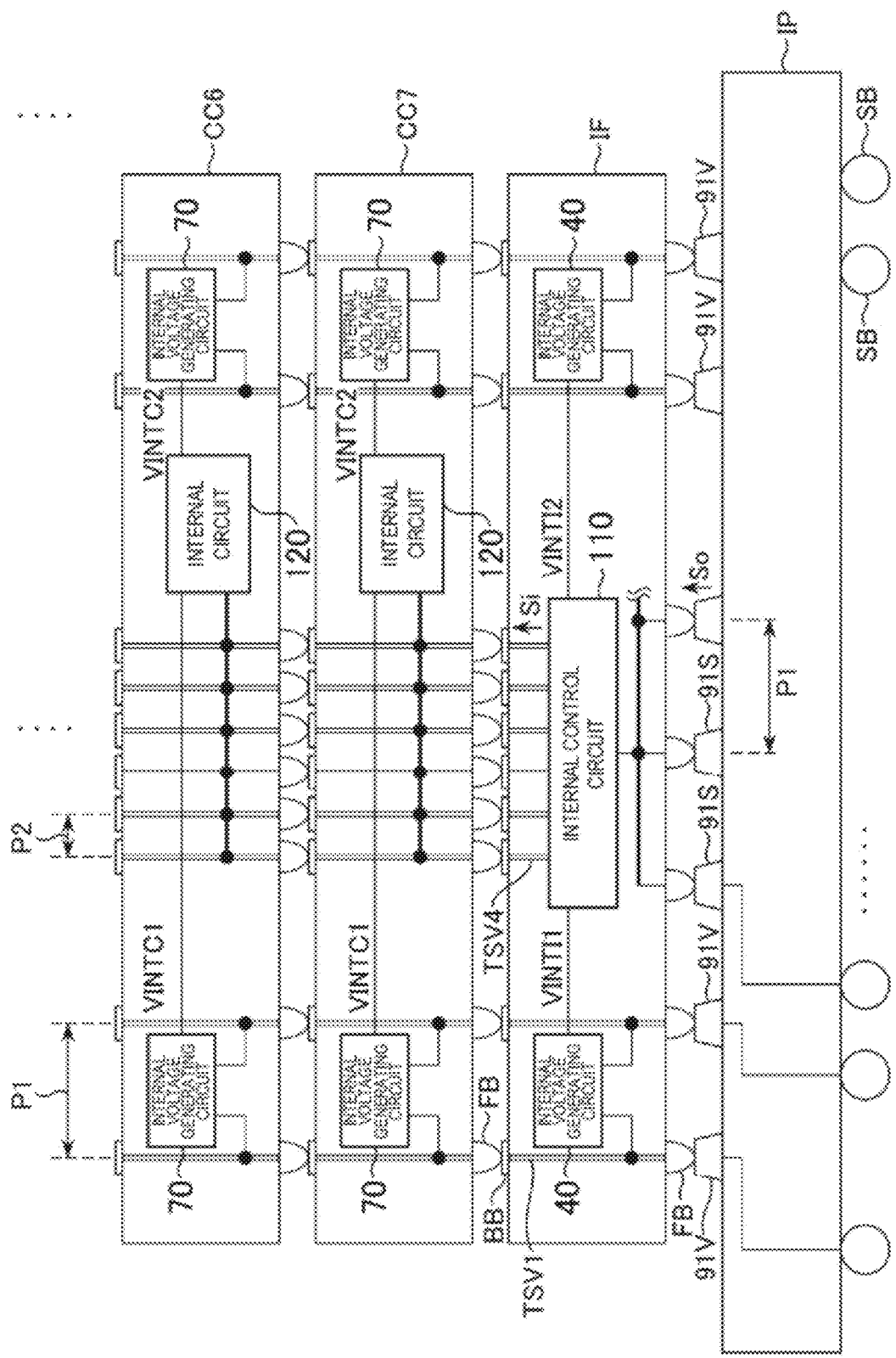
FIG. 8 is a schematic cross-sectional view for explaining positions of the terminals provided in the interface chip IF and the core chips CC0 to CC7.

Turning to FIG. 8, the interposer IP and the interface chip IF are connected via the substrate terminals 91. More precisely, the substrate terminals 91 provided on the interposer IP and the front bumps FB provided on the interface chip IF are connected with each other. As describe above, the interposer IP has the processing accuracy lower than that of the semiconductor chips, and the substrate terminals 91 and the front bumps FB of the interface chip IF are arranged at an arrangement pitch P1. The arrangement pitch P1 is equal to a shortest distance between adjacent terminals.

In FIG. 8, circuit blocks other than the internal voltage generating circuits 40 among the various internal circuits included in the interface chip IF are referred to as an internal control circuit 110. Accordingly, the internal control circuit 110 receives various external signals So (such as an address and a command) supplied through the interposer IP, and generates internal signals Si (such as an internal command) based on the signals So. Meanwhile, the internal voltage generating circuits 40 receive a power supply voltage supplied through the interposer IP, and generate various internal voltages VINTI1, VINTI2, and the like. These internal voltages VINTI1 and VINTI2 are supplied to the internal control circuit 110 and are used as operation voltages of the internal control circuit 110.

An external voltage is supplied to the internal voltage generating circuits 40 by using the through silicon via TSV1 of the type shown in FIG. 3. Accordingly, among the substrate terminals 91 provided on the interposer IP, substrate power supply terminals 91V that supply the external voltage all have the same plan positions as those of the corresponding front bumps FB, through silicon vias TSV1, and back bumps BB of the interface chip IF. That is, each of the substrate power supply terminals 91V is vertically connected straight to the back bump BB of the interface chip IF and there is no planar roundabout route. Furthermore, the through silicon vias TSV have across section quite larger than that of a planar wiring formed on the chip and thus have a small electrical resistance. Accordingly, a voltage drop caused by passage through the through silicon via TSV is of a vanishingly low level.

On the other hand, the external signal So is supplied to the internal control circuit 110 by using the front bump FB shown in FIG. 6. The internal signal Si output from the internal control circuit 110 is supplied to the back bumps BB through the through silicon vias TSV4 of the type shown in FIG. 5. Accordingly, plan positions of substrate signal terminals 91S for supplying the external signal So among the substrate terminals 91 provided on the interposer IP are not basically the same as those of the corresponding back bumps BB of the interface chip IF. The back bump BB connected to the through silicon via TSV4 may be also referred to as "chip signal terminal". As mentioned above, the interface chip IF has the processing accuracy higher than that of the interposer IP and thus an arrangement pitch P2 of the back bumps BB through which the internal signal Si is output is smaller than the arrangement pitch P1 of the substrate terminals 91. Although not shown in FIG. 8, the external voltages VDD and GND as well as the internal voltages VINTI1 and VINTI2 are also supplied to the internal control circuit 110. The external voltages VDD and GND to be supplied to the internal control circuit 110 are also connected to the through silicon vias TSV4 through a wiring layer provided in the interface chip IF. These through silicon vias TSV4 are also arranged at the arrangement pitch P2.

Figure 9:
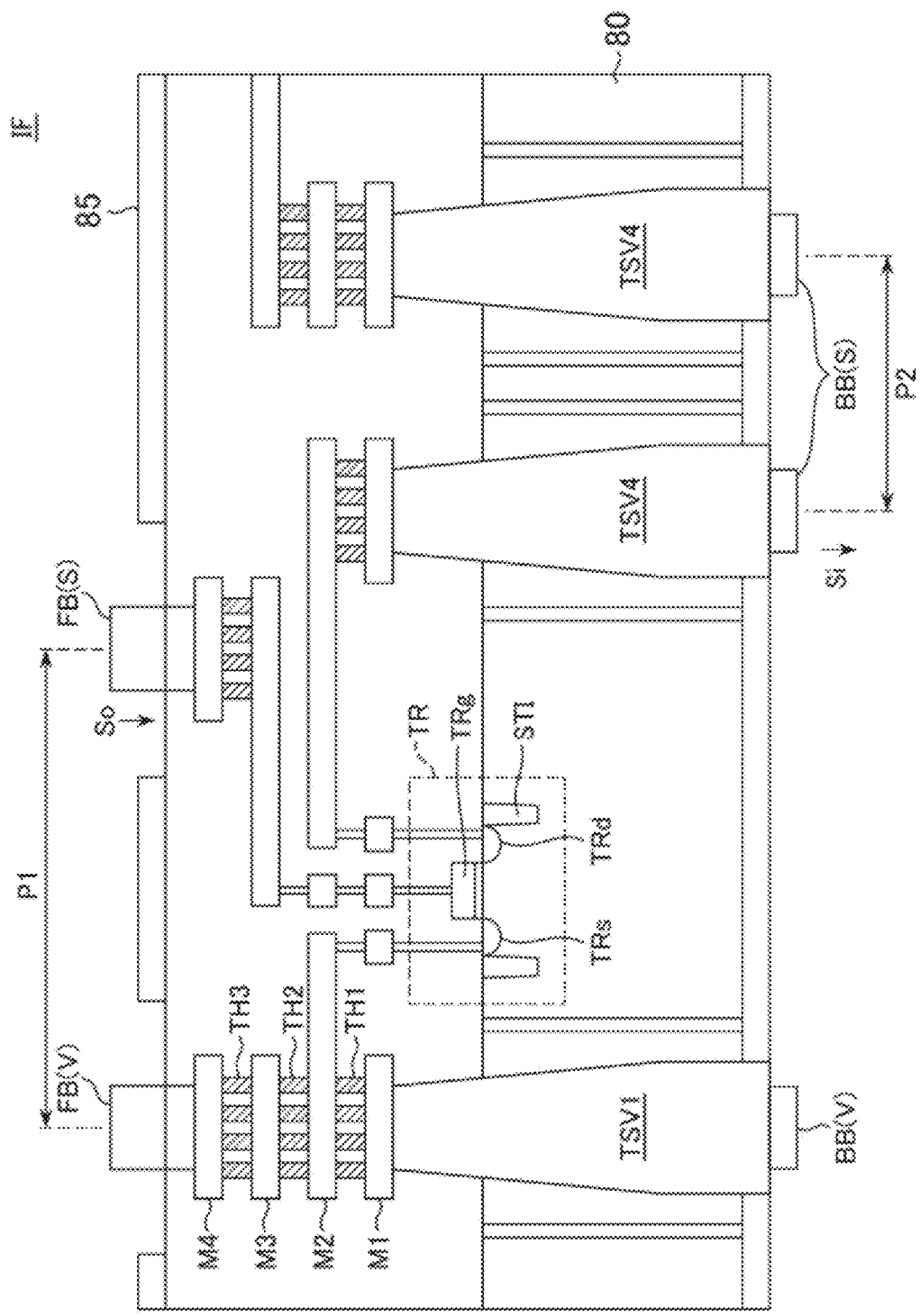
FIG. 9 is a partial cross-sectional view indicative of an embodiment of the interface chip IF in an enlarged manner.

Turning to FIG. 9, note that the upper side in this figure is a side to be connected to the interposer IP and the lower side is a side to be connected to the core chips CC0 to CC7.

In an example shown in FIG. 9, each front bump FB(V) for power supply is connected through the through silicon via TSV1 to a corresponding back bump BB (V) for power supply and is also connected through a wiring layer drawn out of a pad M2 to a source region TRs of a transistor TR. The transistor TR is a MOS transistor formed in the silicon substrate 80 and is surrounded by a shallow trench isolation region STI. The transistor TR has a gate electrode TRg connected to a front bump FB(S) for signals and has a drain TRd connected to a back bump BB(S) for signals through the through silicon via TSV4. The arrangement pitch P2 of the back bumps BB(S) is smaller than the arrangement pitch P1 of the front bumps FB.

The core chips CC0 to CC7 are stacked on the interface chip IF having the configuration mentioned above. The front bumps FB provided on the core chips CC0 to CC7 and connected to the back bumps BB of the interface chips IF may be also referred to as "third chip terminals".

As shown in FIG. 8, the through silicon vias TSV provided in the core chips CC0 to CC7 have the same plan formation positions as viewed from the stacking direction regardless of the type. Accordingly, the through silicon vias TSV for power supply are arranged at the arrangement pitch P1 and the through silicon vias TSV for signals are arranged at the arrangement pitch P2. In FIG. 8, circuit blocks other than the internal voltage generating circuits 70 among the various internal circuits included in the core chips CC0 to CC7 are referred to as internal circuits 120. Various internal voltages VINTC1, VINTC2, and the like, generated by the internal voltage generating circuits 70 are supplied to the internal circuit 120 and are used as operation voltages for the internal circuit 120.

Figure 10:
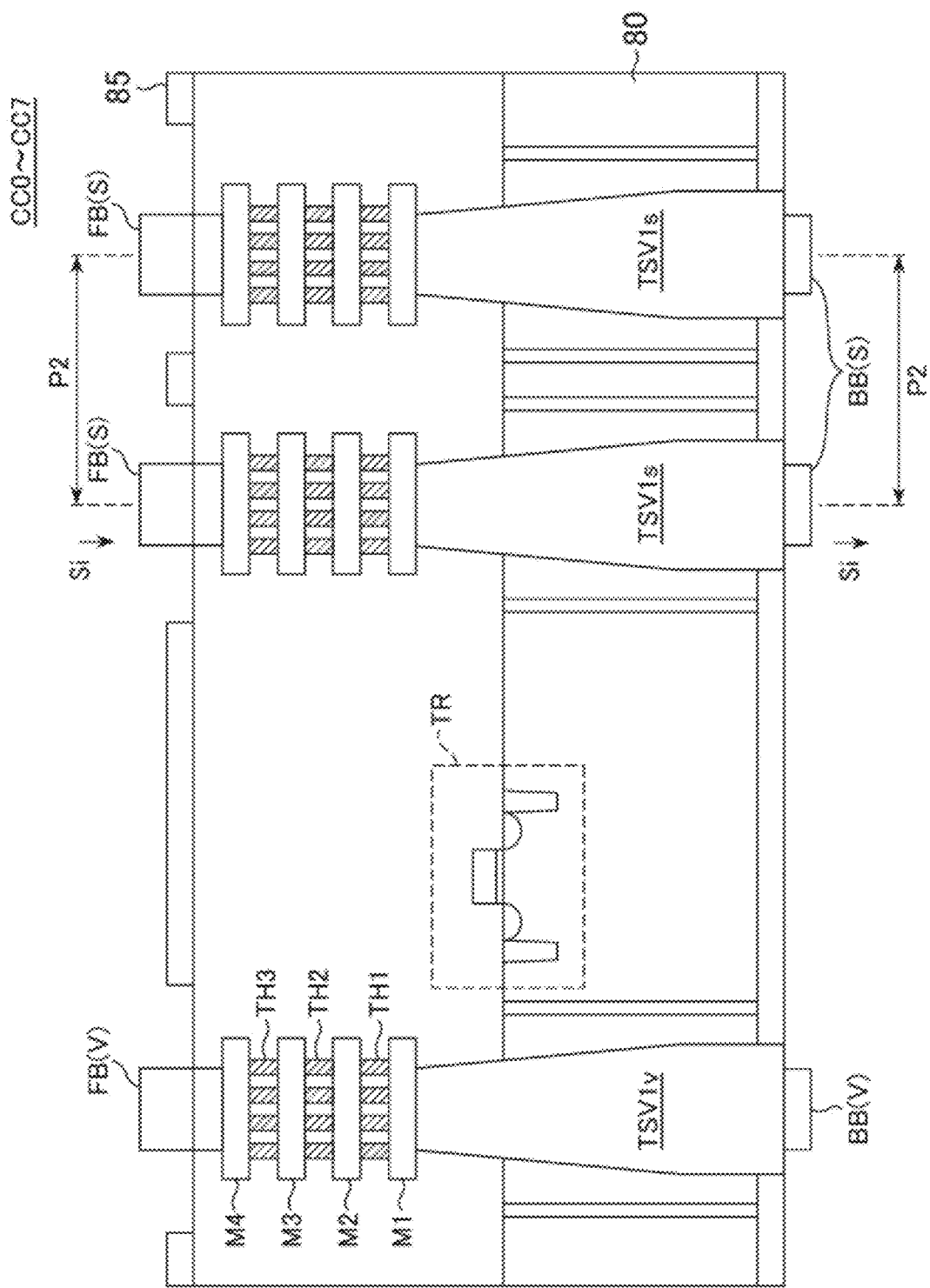
FIG. 10 is a partial cross-sectional view indicative of an embodiment of the core chips CC0 to CC7 in an enlarged manner.

Turning to FIG. 10, the upper side in this figure is a side to be connected to the interface chip IF. Positions in the horizontal direction in FIG. 10 correspond to positions in the horizontal direction in FIG. 9.

In an example shown in FIG. 10, front bumps FB(V) for power supply and front bumps FB(S) for signals are connected to back bumps BB(V) for power supply and back bumps BB(S) for signals, respectively, through the through silicon vias TSV1. Among these, the front bumps FB(S) for signals and the back bumps BB(S) for signals have the arrangement pitch P2. Among the through silicon vias TSV1, those for power supply are referred to as through silicon vias TSV1$v$ and those for signals are referred to as through silicon vias TSV1$s$.

Figure 11:
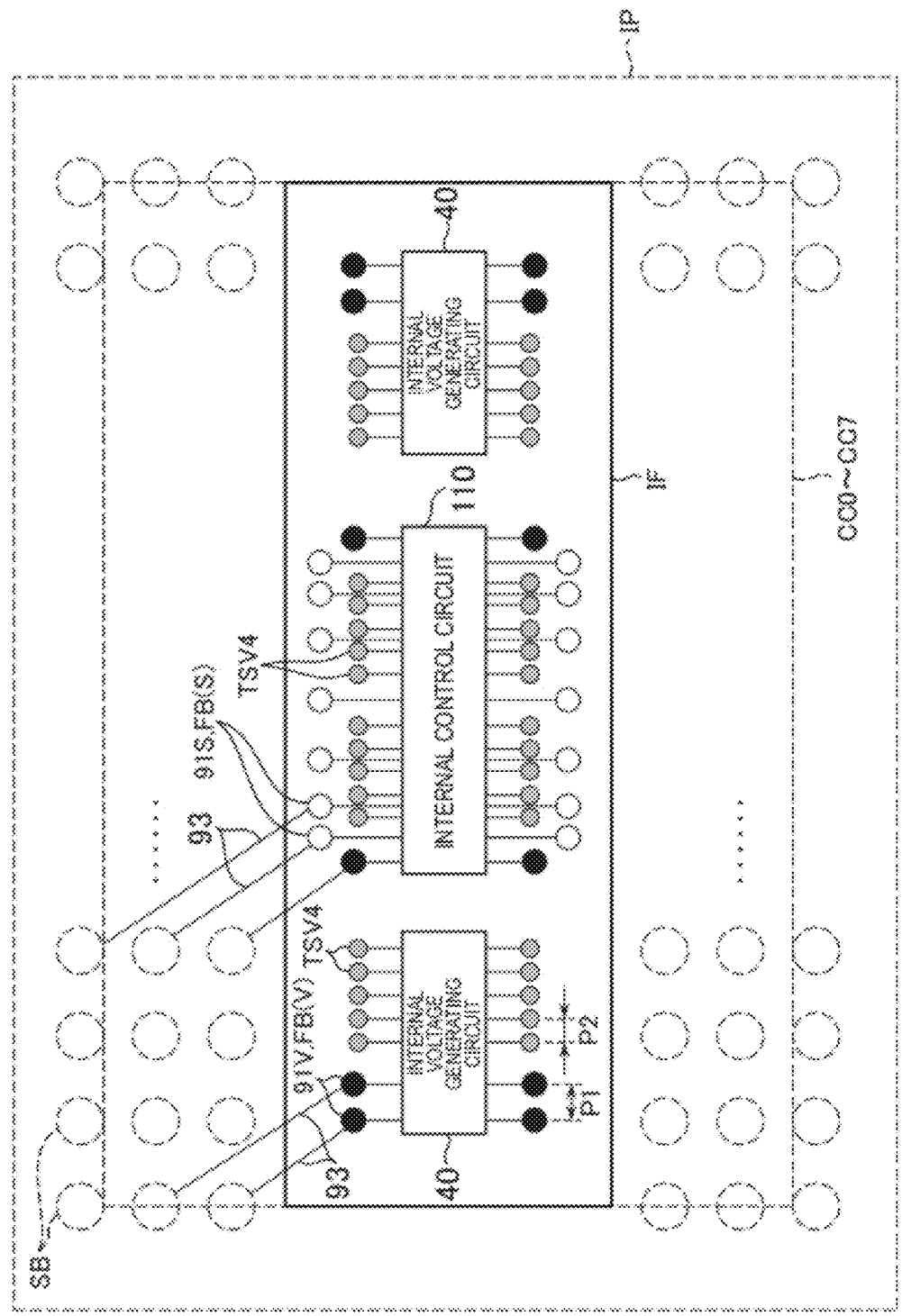
FIG. 11 is a schematic plan view for explaining positions of the terminals provided on the interface chip IF and the core chips CC0 to CC7 and mainly shows constituent elements of the interface chip IF.
Figure 12:
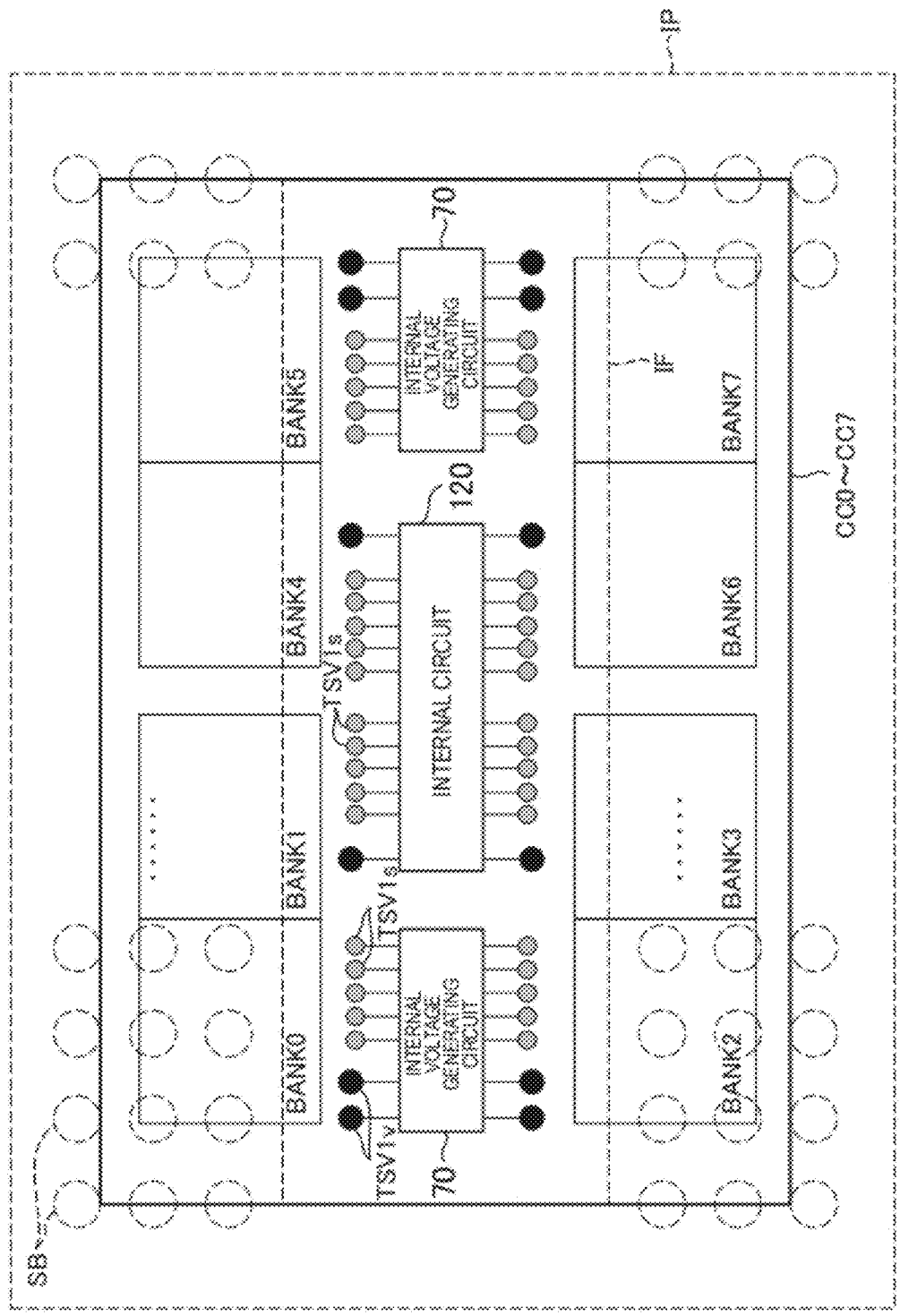
FIG. 12 is a schematic plan view for explaining positions of the terminals provided on the interface chip IF and the core chips CC0 to CC7 and mainly shows constituent elements of the core chips CC0 to CC7.

Turning to FIGS. 11 and 12, the interface chip IF has a plan size smaller than that of the core chips CC0 to CC7 in this example. The external terminals SB provided on the interposer IP and the interface chip IF are connected through the rewiring layer 93 and the substrate terminals 91 provided on the interposer IP. Among the substrate terminals 91, the substrate power supply terminals 91V for power supply are connected to the front bumps FB (V) shown by black circles in FIG. 11 and the substrate signal terminals 91S for signals are connected to the front bumps FB (S) shown by white circles in FIG. 11. The through silicon vias TSV4 leading to the back bumps BB are shown by small gray circles. It can be understood also from FIG. 11 that P1>P2.

The front bumps FB(V) shown in FIG. 11 have the same plan positions as those of the through silicon vias TSV1$v$ shown in FIG. 12. The through silicon vias TSV1$v$ in FIG. 12 indicate the through silicon vias TSV1 for power supply provided in the core chips CC0 to CC7. The through silicon vias TSV4 shown in FIG. 11 have the same plan positions as those of the through silicon vias TSV1$s$ shown in FIG. 12. The through silicon vias TSV1$s$ in FIG. 12 indicate the through silicon vias TSV1 for signals provided in the core chips CC0 to CC7. In an example shown in FIG. 12, the internal voltage generating circuits 70 and the internal circuit 120 are arranged between banks. Some of the through silicon vias TSV1$v$ in the core chips CC0 to CC7 are laid out at the ends of the core chips CC0 to CC7. Because the power supply voltage is likely to decrease at the ends of the core chips, the through silicon vias TSV1$v$ are arranged in these areas to suppress fluctuations of the power supply voltage within the planes of the chips.

Figure 13:
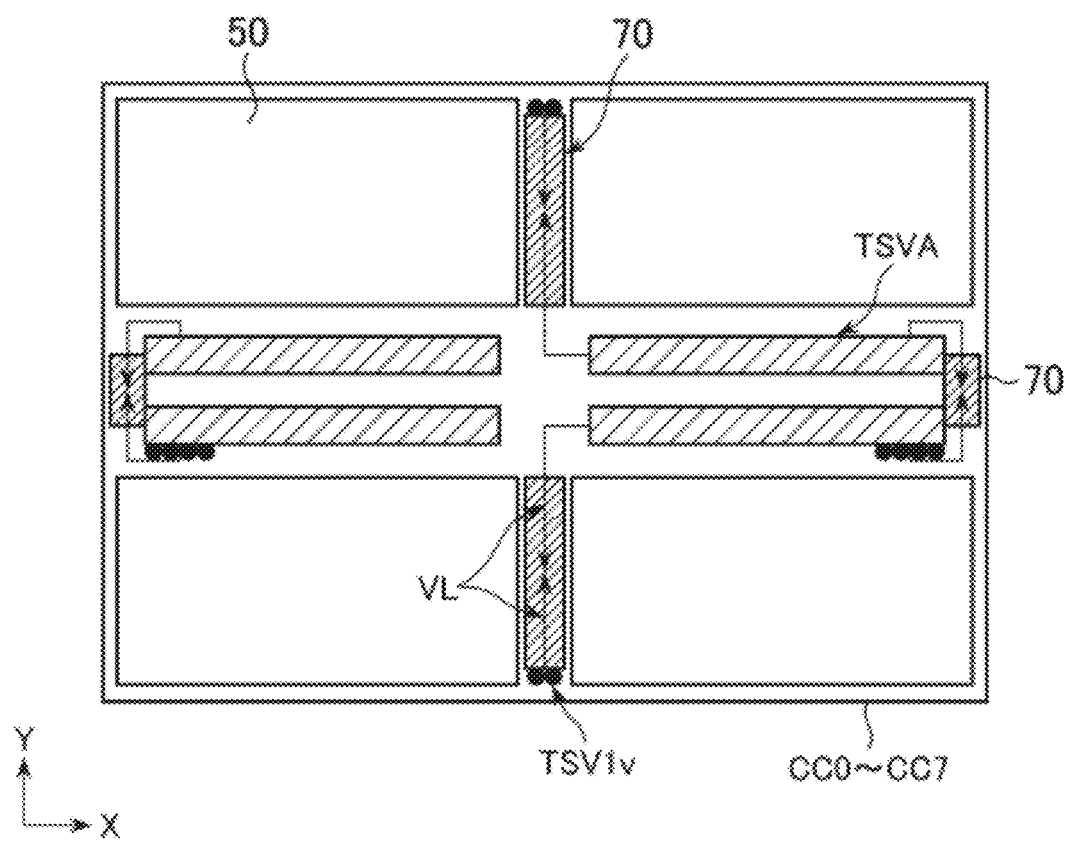
FIG. 13 is a schematic plan view for explaining an exemplary layout of the through silicon vias TSV1*v* for power supply and the through silicon vias TSV1*s* for signals.

In an example shown in FIG. 13, the memory cell arrays 50 are laid out in matrix in an X direction and a Y direction. The internal voltage generating circuit 70 is placed between two memory cell arrays 50 located side by side in the X direction and an area TSVA including a plurality of the through silicon vias TSV1$s$ for signals is placed between two memory cell arrays 50 located side by side in the Y direction. The through silicon vias TSV1$s$ arranged in the area TSVA has the arrangement pitch P2. In the area TSVA, as well as the through silicon vias TSV1s for signals, the through silicon vias TSV1v for power supply are also arranged and power supplied therethrough is supplied to the internal voltage generating circuit 70 via a power supply line VL.

However, when the internal voltage generating circuit 70 is located at the end of the chip or away from the area TSVA as shown in FIG. 13, the power supply line VL increases in length and thus there is a risk that sufficient power cannot be supplied to the internal voltage generating circuit 70. To overcome this situation, a plurality of through silicon vias TSV1v for power supply are arranged near the internal voltage generating circuit 70 in the example shown in FIG. 13. This enables sufficient power to be supplied to the internal voltage generating circuit 70.

In this way, according to the present embodiment, a route for supplying the external voltage from the interposer IP straight to each of the core chips CC0 to CC7 is provided and accordingly the power supply voltage to be supplied to the core chips CC0 to CC7 can be stabilized.

It is apparent that the present invention is not limited to the above embodiments, but may be modified and changed without departing from the scope and spirit of the invention.

For example, while the front bumps FB of the interface chip IF are connected to the interposer IP and the back bumps BB of the interface chip IF are connected to the core chips CC0 to CC7 in the present embodiment, it is possible to connect the front bumps FB of the interface chip IF to the core chips CC0 to CC7 and connect the back bumps BB of the interface chip IF to the interposer IP. Similarly, orientations of the core chips CC0 to CC7 are not particularly limited.

Furthermore, while the interface chip IF is used as an example of a control chip and the core chips CC0 to CC7 are used as an example of a controlled chip in the present embodiment, the control chip and the controlled chip are not limited thereto. Similarly, while the interposer IP is used as an example of the substrate in the present embodiment, the substrate is not limited thereto.

What is claimed is:

1. A semiconductor device comprising:
a substrate on which a plurality of substrate terminals including a plurality of substrate power supply terminals are provided;
a first semiconductor chip stacked on the substrate, the first semiconductor chip having one surface on which a plurality of first chip terminals each connected to an associated one of the substrate terminals are provided and the other surface on which a plurality of second chip terminals including a plurality of chip power supply terminals and a plurality of chip signal terminals are provided; and
a second semiconductor chip stacked on the first semiconductor chip, the second semiconductor chip having one surface on which a plurality of third chip terminals each connected to an associated one of the second chip terminals are provided, wherein
the first semiconductor chip has a plurality of power supply penetration electrodes each penetrating through the first semiconductor chip and electrically connecting an associated one of the chip power supply terminals to an associated one of the substrate power supply terminals, each of the power supply penetration electrodes is vertically aligned with the associated one of the chip power supply terminals and the associated one of the substrate power supply terminals, and
the chip signal terminals have an arrangement pitch smaller than an arrangement pitch of the chip power supply terminals.

2. The semiconductor device as claimed in claim 1, wherein
the substrate terminals further include a plurality of substrate signal terminals,
the first semiconductor chip comprises an internal control circuit that generates an internal signal based on an external signal supplied from the substrate signal terminals through the first chip terminals, and
the internal signal is supplied to the second semiconductor chip through the chip signal terminals.

3. The semiconductor device as claimed in claim 2, wherein
the first semiconductor chip further includes a plurality of signal penetration electrodes each electrically connecting the internal control circuit to an associated one of the substrate signal terminals or an associated one of the chip signal terminals, and
each of the signal penetration electrodes is arranged in different planar position from one of the associated one of the substrate signal terminals and the associated one of the chip signal terminals.

4. The semiconductor device as claimed in claim 2, wherein
the first semiconductor chip further includes an internal voltage generating circuit that generates an internal voltage based on an external voltage supplied from the substrate power supply terminals through the first chip terminals, and
the internal voltage is supplied to the internal control circuit.

5. The semiconductor device as claimed in claim 1, wherein a plurality of the second semiconductor chips are provided, and the second semiconductor chips are electrically connected in common through a plurality of penetration electrodes formed at positions where the third chip terminals are provided, respectively.

6. The semiconductor device as claimed in claim 1, wherein one of the third chip terminals connected to an associated one of the chip power supply terminals is located at an end of the second semiconductor chip.

7. The semiconductor device as claimed in claim 1, wherein
the first semiconductor chip is an interface chip in which front end units of a memory device are integrated, and
the second semiconductor chip is a core chip in which a back end units of the memory device are integrated.

8. The semiconductor device as claimed in claim 1, wherein the substrate comprises a plurality of external terminals connected to the substrate terminals through a rewiring layer.

9. A semiconductor device comprising:
a substrate having one surface on which a plurality of first and second terminals are provided, the first terminals being supplied with a power supply voltage, and second terminals being supplied with first signals;
a first semiconductor chip stacked on the substrate, the first semiconductor chip having one surface on which a plurality of third and fourth terminals are provided and the other surface on which a plurality of fifth and sixth terminals are provided, each of the third terminals being connected to an associated one of the first terminals, and each of the fourth terminals being connected to an associated one of the second terminals; and
a second semiconductor chip stacked on the first semiconductor chip, the second semiconductor chip having one surface on which a plurality of seventh and eighth terminals are provided, each of the seventh terminals being connected to an associated one of the fifth terminals, and each of the eighth terminals being connected to an associated one of the sixth terminals, wherein the fifth and seventh terminals are supplied with the power supply voltage, the sixth and eighth terminals are supplied with second signals, the fifth and seventh terminals are arranged in a first arrangement pitch, and the sixth and eighth terminals are arranged in a second arrangement pitch that is smaller than the first arrangement pitch.

10. The semiconductor device as claimed in claim 9, wherein the first semiconductor chip includes an internal control circuit that generates the second signals based on the first signals supplied from the fourth terminals.

11. The semiconductor device as claimed in claim 9, wherein the first and third terminals are arranged in the first arrangement pitch.

12. The semiconductor device as claimed in claim 9, wherein the second and fourth terminals are arranged in the first arrangement pitch.

13. A device comprising:
a semiconductor substrate including first and second surfaces opposite to each other;
first and second penetration electrodes each penetrating through the semiconductor substrate;
first and second bumps each formed on a side of the first surface of the semiconductor substrate, the first bump being electrically connected to and vertically aligned with the first penetration electrode, and the second bump being electrically connected to and vertically aligned with the second penetration electrode; and
third and fourth bumps each formed on a side of the second surface of the semiconductor substrate, the third bump being electrically connected to and vertically aligned with the first penetration electrode, and fourth bump being electrically connected to and vertically deviated from the second penetration electrode,
wherein the first penetration electrode is controllably electrically connected to the second penetration electrode by a control signal applied to the fourth bump.

14. The device as claimed in claim 13, further comprising a wiring structure formed on the second surface of the semiconductor substrate, each of the third and fourth bumps being formed on the wiring structure, the wiring structure including a first interconnection line electrically couples the third bump and the first penetration electrode to each other and a second interconnection line electrically couples the fourth bump and the second penetration electrode to each other.

15. The device as claimed in claim 13, further comprising:
a third penetration electrode penetrating through the semiconductor substrate, the third penetration electrode being provided adjacently to the first penetration electrode;
a fifth bump formed on the side of the first surface of the semiconductor substrate, the fifth bump being electrically connected to and vertically aligned with the third penetration electrode;
a sixth bump formed on the side of the second surface of the semiconductor substrate, the sixth bump being electrically connected to and vertically aligned with the third penetration electrode;
a fourth penetration electrode penetrating through the semiconductor substrate, the fourth penetration electrode being provided adjacently to the second penetration electrode; and
a seventh bump formed on the side of the first surface of the semiconductor substrate, the seventh bump being electrically connected to and vertically aligned with the fourth penetration electrode;
an interval between the first and third penetration electrodes being greater than an interval between the second and fourth penetration electrodes.

16. The device as claimed in claim 15, wherein an area of the side of the second surface vertically aligned with the fourth penetration electrode is free from any bumps.

17. The device as claimed in claim 14, further comprising an internal control circuit on the side of the first surface of the semiconductor substrate, the internal control circuit electrically connected to the second interconnection line.

18. The device as claimed in claim 17, wherein the third bump is supplied with a power supply voltage and the fourth bump is supplied with an external control signal to control the internal control circuit.

19. The device as claimed in claim 18, wherein the first bump is supplied with the power supply voltage via the first penetration electrode and the second bump is supplied with an internal control signal via the second penetration electrode, the internal control signal being generated in the internal control circuit in response to the external control signal and transferred to the second penetration electrode.

\* \* \* \* \*